(12) United States Patent
Goko

(10) Patent No.: US 6,601,198 B1
(45) Date of Patent: Jul. 29, 2003

(54) SEMICONDUCTOR INTEGRATED CIRCUIT

(75) Inventor: Hiroki Goko, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/560,885

(22) Filed: Apr. 28, 2000

(30) Foreign Application Priority Data

Dec. 2, 1999 (JP) .......................................... 11-343175

(51) Int. Cl.[7] .............................................. G11C 29/00
(52) U.S. Cl. ........................ 714/718; 714/719; 365/201
(58) Field of Search ................................ 714/718, 719; 365/201

(56) References Cited

U.S. PATENT DOCUMENTS

| | | | |
|---|---|---|---|
| 5,475,692 A | * 12/1995 | Hatano et al. | 714/719 |
| 5,583,817 A | * 12/1996 | Kawaguchi et al. | 365/201 |
| 5,703,818 A | * 12/1997 | Osawa | 365/201 |
| 5,724,367 A | * 3/1998 | Osawa et al. | 714/720 |
| 5,815,744 A | * 9/1998 | Ohmiya | 396/72 |
| 5,825,783 A | * 10/1998 | Momohara | 714/718 |
| 5,987,635 A | * 11/1999 | Kishi et al. | 714/724 |
| 6,016,560 A | * 1/2000 | Wada et al. | 714/718 |
| 6,028,443 A | * 2/2000 | Ozaki | 326/16 |
| 6,070,256 A | * 5/2000 | Wu et al. | 714/718 |
| 6,195,771 B1 | * 2/2001 | Tanabe et al. | 714/718 |
| 6,266,792 B1 | * 7/2001 | Wada et al. | 714/718 |
| 6,397,363 B1 | * 5/2002 | Maeno et al. | 714/726 |
| 6,457,148 B1 | * 9/2002 | Yoshiba | 714/718 |

* cited by examiner

*Primary Examiner*—Albert Decady
*Assistant Examiner*—Anthony T. Whittington
(74) *Attorney, Agent, or Firm*—Volentine Francos, PLLC

(57) ABSTRACT

A semiconductor integrated circuit includes logic circuits, each of which receives an input signal and generates an output signal having bits, and a selector which is coupled to the logic circuits and selectively transfers either one of the output signals output from the logic circuits in response to a selection signal. The semiconductor integrated circuit also includes a comparator which compares the output signals output from the logic circuits with an expected value signal and outputs a result of the comparison, and output terminals. The semiconductor integrated circuit also includes an output buffer which is coupled between the selector and the output terminals, and which controls transferring the output signal transferred from the selector to the output terminals in response to the result of the comparison.

20 Claims, 5 Drawing Sheets

SEMICONDUCTOR INTEGRATED CIRCUIT

BACKGROUND OF THE INVENTION

1. Field of the Invention

The present invention generally relates to a semiconductor integrated circuit including a test circuit which tests two or more circuits, and more particularly, to a semiconductor integrated circuit which tests a plurality of circuits which should be produced as the same structure.

This application is counterparts of Japanese patent applications, Serial Number 343175/1999, filed December 2, the subject matter of which is incorporated herein by reference.

2. Description of the Related Art

Conventional circuit which tests whether two or more circuits which should be produced as the same structure are actually produced as the same structure, is comprised of a selector connected to outputs of the two or more circuits and an output buffer circuit connected between the selector and an output terminal.

The selector selectively transfers a signal of any one circuit among the two or more circuits in response to a selection signal. The output buffer circuit transfers an output signal from the selector to the output terminal.

The signal applied to the output terminal is compared with an expected value signal by a tester. By the above operation, whether or not the selected circuit is correctly produced can be tested.

In the conventional circuit, the same test has to be repeated for times corresponding to the number of circuits which should be tested, and there was a problem that test time increased.

Consequently, there has been a need for an improved semiconductor integrated circuit.

SUMMARY OF THE INVENTION

It is an object of the present invention is to provide a semiconductor integrated circuit that may reduce a test time for testing logic circuits.

According to one aspect of the present invention, for achieving one or more of the above objects, there is provided a semiconductor integrated circuit which includes logic circuits, each of which receives an input signal and generates an output signal comprising bits, and a selector which is coupled to the logic circuits and selectively transfers either one of the output signals output from the logic circuits in response to a selection signal. The semiconductor integrated circuit also includes a comparator which compares the output signals output from the logic circuits with an expected value signal and outputs a result of the comparison, and output terminals. The semiconductor integrated circuit also includes an output buffer which is coupled between the selector and the output terminals, and controls transferring the output signal transferred from the selector to the output terminals in response to the result of the comparison.

The above and further objects and novel features of the invention will more fully appear from the following detailed description, appended claims and the accompanying drawings.

DETAILED DESCRIPTION OF THE PREFERRED EMBODIMENTS

First Preferred Embodiment

Figure 1:
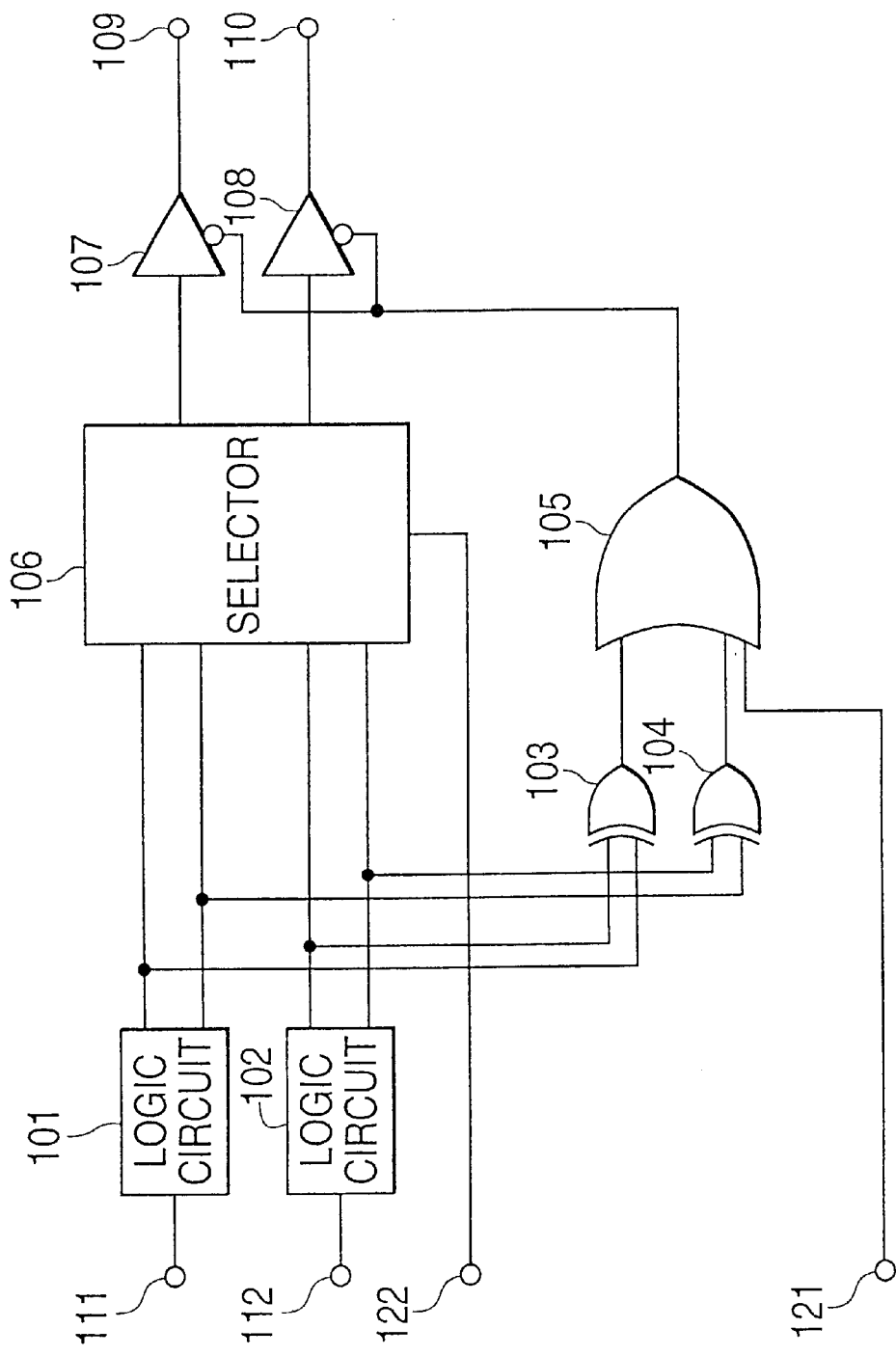
FIG. 1 is a circuit diagram showing a semiconductor device according to a first preferred embodiment of the present invention.

A semiconductor device according to preferred embodiments of the present invention will be explained hereinafter with reference to figures. In order to simplify explanation, like elements are given like or corresponding reference numerals through the specification and figures. Dual explanations of the same elements are avoided.

FIG. 1 is a circuit diagram showing a semiconductor device according to a first preferred embodiment of the present invention.

The semiconductor integrated circuit of the invention made up of a logic circuit 101, a logic circuit 102, an exclusive OR circuit 103, an exclusive OR circuit 104, an OR circuit 105, a selector 106, a 3-state buffer 107 and a 3-state buffer 108. A comparison circuit is composed of the exclusive OR circuit 103, the exclusive OR circuit 104 and the logic circuit 105. The output buffer circuit is comprised of the 3-state buffer 107 and the 3-state buffer 108.

The logic circuit 101 and the logic circuit 102 are circuits that outputting the same signal is expected when the same input signal is applied to the logic circuit 101 and the logic circuit 102.

The logic circuit 101 and the logic circuit 102 output a signal having a 2-bits, respectively.

The exclusive OR circuit 103 has a first input terminal to which the first bit of the output signal of the logic circuit 101 is applied and a second input terminal to which the first bit of the output signal of the logical circuit 102 is applied.

The exclusive OR circuit 103 outputs an L level when the level of the first bit of the output signal of the logic circuit 101 and that of the logic circuit 102 are the same. The exclusive OR circuit 103 outputs an H level when the level of the first bit of the output signal of the logic circuit 101 and that of the logic circuit 102 are not the same.

The exclusive OR circuit 104 has a first input terminal to which the second bit of the output signal of the logic circuit 101 is applied and a second input terminal to which the second bit of the output signal of the logic circuit 102 is applied.

The exclusive OR circuit 104 outputs an L level when the level of the second bit of the output signal of the logic circuit 101 and that of the logic circuit 102 are the same. The exclusive OR circuit 103 outputs an H level when the level of the second bit of the output signal of the logic circuit 101 and that of the logic circuit 102 are not the same.

The OR circuit 105 has a first input terminal connected to a test terminal 121 with which a test signal is given, a second input terminal connected to an output terminal of the exclusive OR circuit 104 and a third input terminal connected to an output terminal of the exclusive OR circuit 103.

The selector 106 is connected to the output terminals of the logic circuit 101, the output terminals of the logic circuit 102 and a selection terminal 122 with which a selection signal is supplied. The selector 106 selectively transfers either the output signal of the logic circuit 101 or the output signal of the logic circuit 102 in response to the selection signal.

The first bit of the output signal of the selector 106 and the second bit of the output signal of the selector 106 are applied to an input terminal of the 3-state buffer 107 and an input terminal of the 3-state buffer 108, respectively. Control terminals of the 3-state buffer 107 and 3-state buffer 108 are connected to the output of the OR circuit 105. An output terminal of the 3-state buffer 107 and an output terminal of the 3-state buffer 108 are connected to an output terminal 109 and an output terminal 110, respectively. The 3-state buffer 107 and the 3-state buffer 108 transfer the first bit of the output signal of the selector 106 and the second bit of the output signal of the selector 106, in response to an output signal output from the OR circuit 105, respectively.

Figure 2:
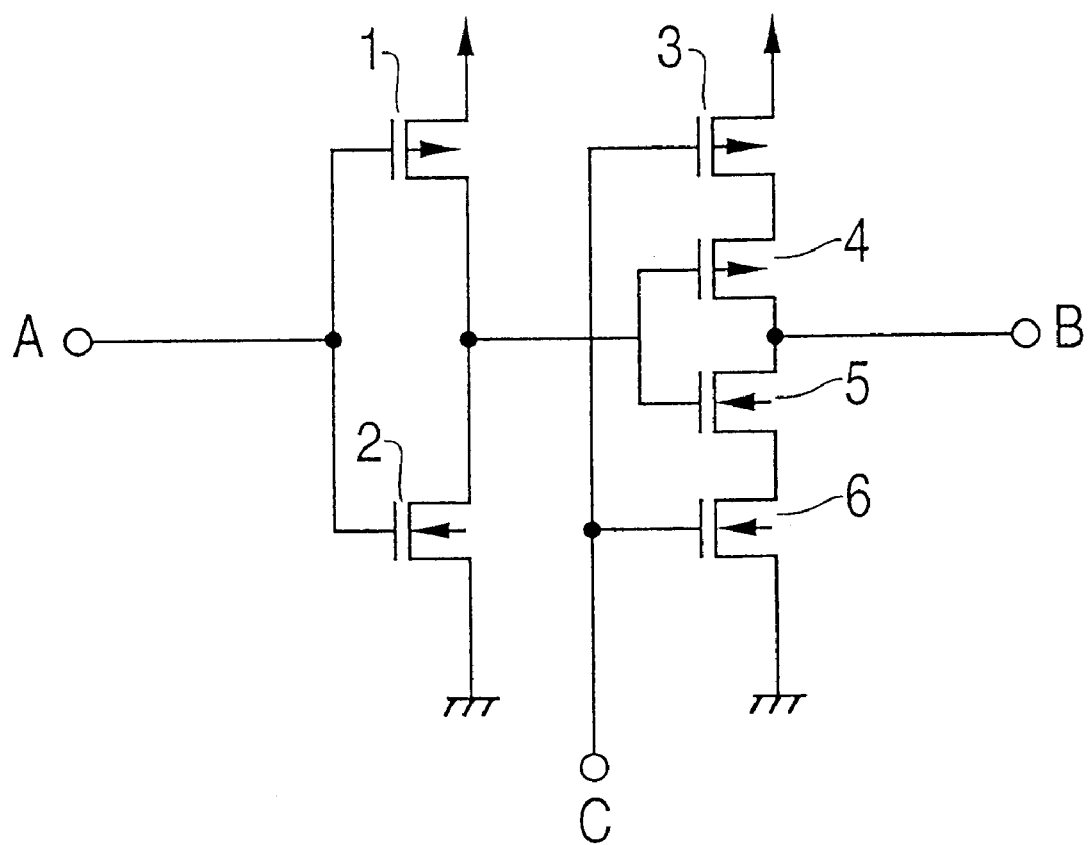
FIG. 2 is a circuit diagram showing the 3-state buffer according to a first preferred embodiment of the present invention.

FIG. 2 is a circuit diagram showing the 3-state buffer according to the first preferred embodiment of the present invention.

The 3-state buffer is made up of P-type MOS transistors 1, 3, and 4 (it is called as PMOS hereinafter) and N-type MOS transistors 2, 5 and 6 (it is called as NMOS hereinafter). An input terminal A of the 3-state buffer (3-state inverter) is connected to the output of the selector 106, an output terminal B of the 3-state buffer is connected to a corresponding output terminal 109 (output terminal 110) and a control terminal C of the 3-state buffer is connected to the output terminal of the OR circuit 105.

Next, operation of the semiconductor integrated circuit according to the first preferred embodiment of the present invention is explained.

First, the same input signal is simultaneously given the input terminal 111 and the input terminal 112. The logic circuit 101 and the logic circuit 102 output signal having 2 bits in response to the input signal, respectively.

The exclusive circuit 103 compares the first bit of the logic circuit 101 and the first bit of the logic circuit 102. The exclusive circuit 103 outputs the L level when the level of the first bit of the logic circuit 101 coincides with the level of the first bit of the logic circuit 102. The exclusive circuit 103 outputs the H level when the level of the first bit of the logic circuit 101 does not coincide with the level of the first bit of the logic circuit 102.

The exclusive circuit 104 compares the second bit of the logic circuit 101 and the second bit of the logic circuit 102. The exclusive circuit 104 outputs the L level when the level of the second bit of the logic circuit 101 coincides with the level of the second bit of the logic circuit 102. The exclusive circuit 104 outputs the H level when the level of the second bit of the logic circuit 101 does not coincide with the level of the second bit of the logic circuit 102.

In this time, the test signal of L level is given to the test terminal 121.

The OR circuit 105 outputs the signal which takes the logic sum of the output signal of the exclusive OR circuit 103 and the output signal of the exclusive OR circuit 104.

The OR circuit 105 outputs the L level when the logic circuit 101 and the logic circuit 102 are produced correctly, i.e., when the logic circuit 101 and the logic circuit 102 output the same level.

The OR circuit 105 outputs the H level when the logic circuit 101 or the logic circuit 102 has a defect, i.e., when the logic circuit 101 and the logic circuit 102 does not output the same level.

The selector 106 transfers one of the output signals of the logic circuit 101 and the logic circuit 102 to the 3-state buffers 107 and 108 in response to a predetermined level.

The first bit of the output signal of the logic circuit selected by the selector 106 is applied to the 3-state buffer 107.

The 3-state buffer 107 transfers the first bit of the output signal of the selected logic circuit to the output terminal 109 when the OR circuit 105 outputs the L level. The 3-state buffer 107 outputs a high impedance to the output terminal 109 when the OR circuit 105 outputs the H level. (The state of the output terminal 109 becomes the high impedance state.)

The second bit of the output signal of the logic circuit selected by the selector 106 is applied to the 3-state buffer 108.

The 3-state buffer 108 transfers the second bit of the output signal of the selected logic circuit to the output terminal 110 when the OR circuit 105 outputs the L level. The 3-state buffer 108 outputs a high impedance to the output terminal 110 when the OR circuit 105 outputs the H level. (The state of the output terminal 110 becomes the high impedance state.)

The output signal of the 3-state buffer 107 and the output signal of the 3-state buffer 108 are output to the output terminal 110 and the output terminal 120, respectively.

A tester inputs the signal applied to the output terminal 109 or the output terminal 110, and compares the signal with the expected value which is stored in the tester. If in agreement, it turns out that the output signals of the logic circuits are the same.

Furthermore, when it is detected that the state of the output terminal 109 or the output terminal 110 is the high impedance state, it turns out that at least one of the output signals of the logic circuits differs from the expected value.

In the semiconductor integrated circuit of the first preferred embodiment, since the logic circuits can be tested simultaneously, a test time can be reduced.

In this preferred embodiment, two logic circuits which output the output signal comprised of two bits are explained.

However, the number of logic circuits is not limited to two but may also be three or more. The output signal may also be comprised of any number of bits. In that case, however, the number of exclusive OR circuits should be the same number of bits of the logic circuit. Moreover, both the number of 3-state buffers and the number of output terminals also should be the same number of bits of the logic circuit.

Second Preferred Embodiment

Figure 3:
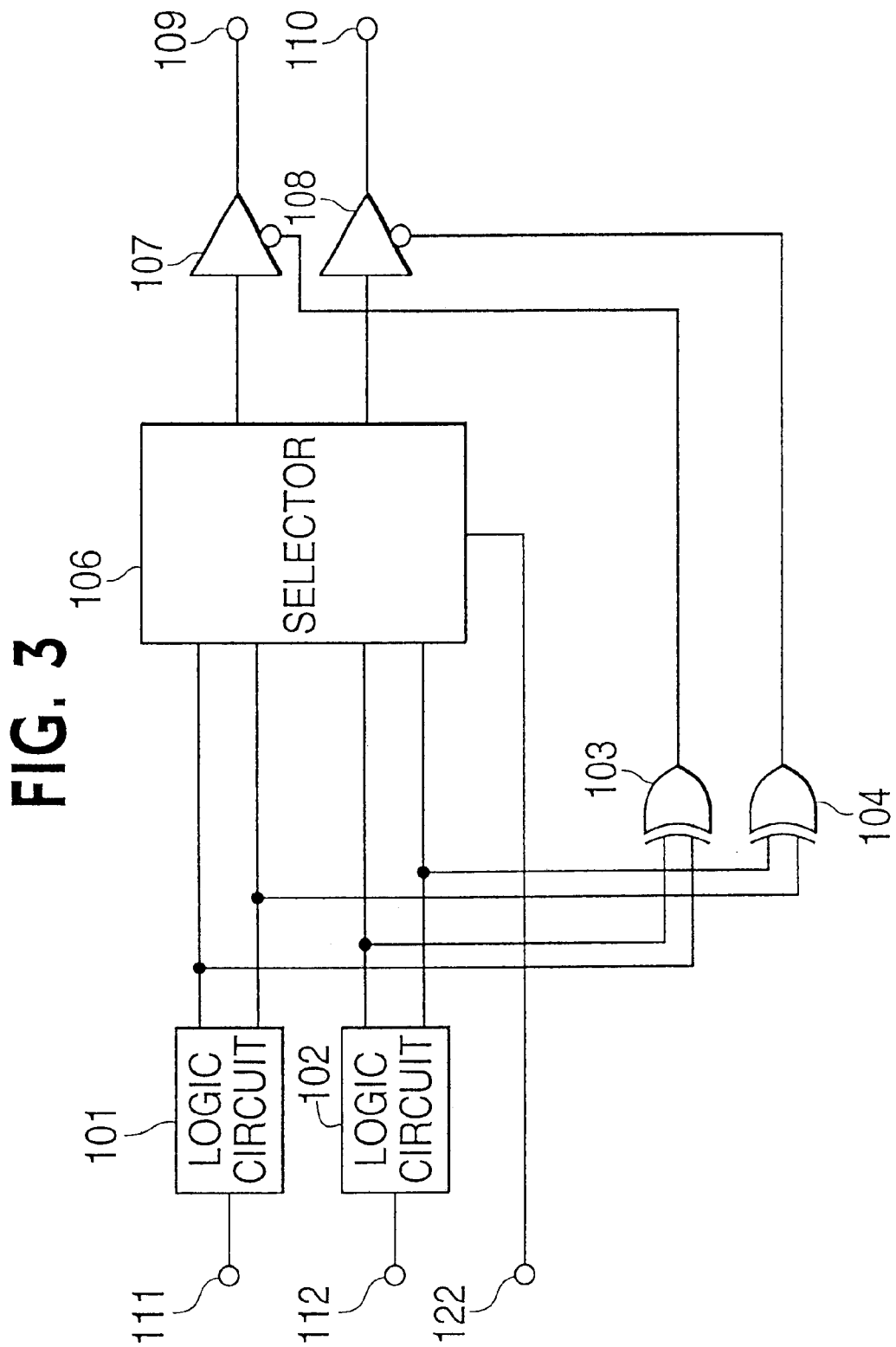
FIG. 3 is a circuit diagram showing a semiconductor integrated circuit according to a second preferred embodiment of the present invention.

FIG. 3 is a circuit diagram showing the semiconductor integrated circuit according to a second preferred embodiment of the present invention. The same reference is given to the same as that of first preferred embodiment, or a corresponding element, and thus dual explanation is omitted.

A comparison circuit is comprised of the exclusive OR circuit 103 and the exclusive OR circuit 104 in this preferred embodiment.

The difference between this preferred embodiment and the first preferred embodiment resides in that the output terminal of the exclusive OR circuit 103 is connected to the control terminal of the 3-state buffer 107, and the output terminal of the exclusive OR circuit 104 is connected to the control terminal of the 3-state buffer 108.

That is, the output terminal of the exclusive OR circuit where the X bits of the output signal of the logic circuit is inputted is connected to the control terminal of the 3-state buffer to which the X bits of the output signal of the logic circuit is applied.

When the first bit of the output signal of the logic circuit 101 and the first bit of the output signal of the logic circuit 102 are not in agreement, the logic circuit 103 outputs the H level, and thus the state of the output terminal of the 3-state buffer 107 becomes the high impedance state.

Thereby, only the output terminal of the 3-state buffer corresponding to the mismatch bit of the output signal of the logic circuit 101 and the logic circuit 102 becomes high impedance.

With the second preferred embodiment, it is enabled to specify mismatch bits, i.e., failure bit, of the output signals of the logic circuits, and thus an evaluation efficiency can be improved.

In this preferred embodiment, two logic circuits which output the output signal comprised of two bits are explained.

However, the number of logic circuits is not limited to two but may also be three or more. The output signal may also be comprised of any number of bits. In that case, however, the number of exclusive OR circuits should be the same number of bits of the logic circuit. Moreover, both the number of 3-state buffers and the number of output terminals also should be the same number of bits of the logic circuit.

Third Preferred Embodiment

Figure 4:
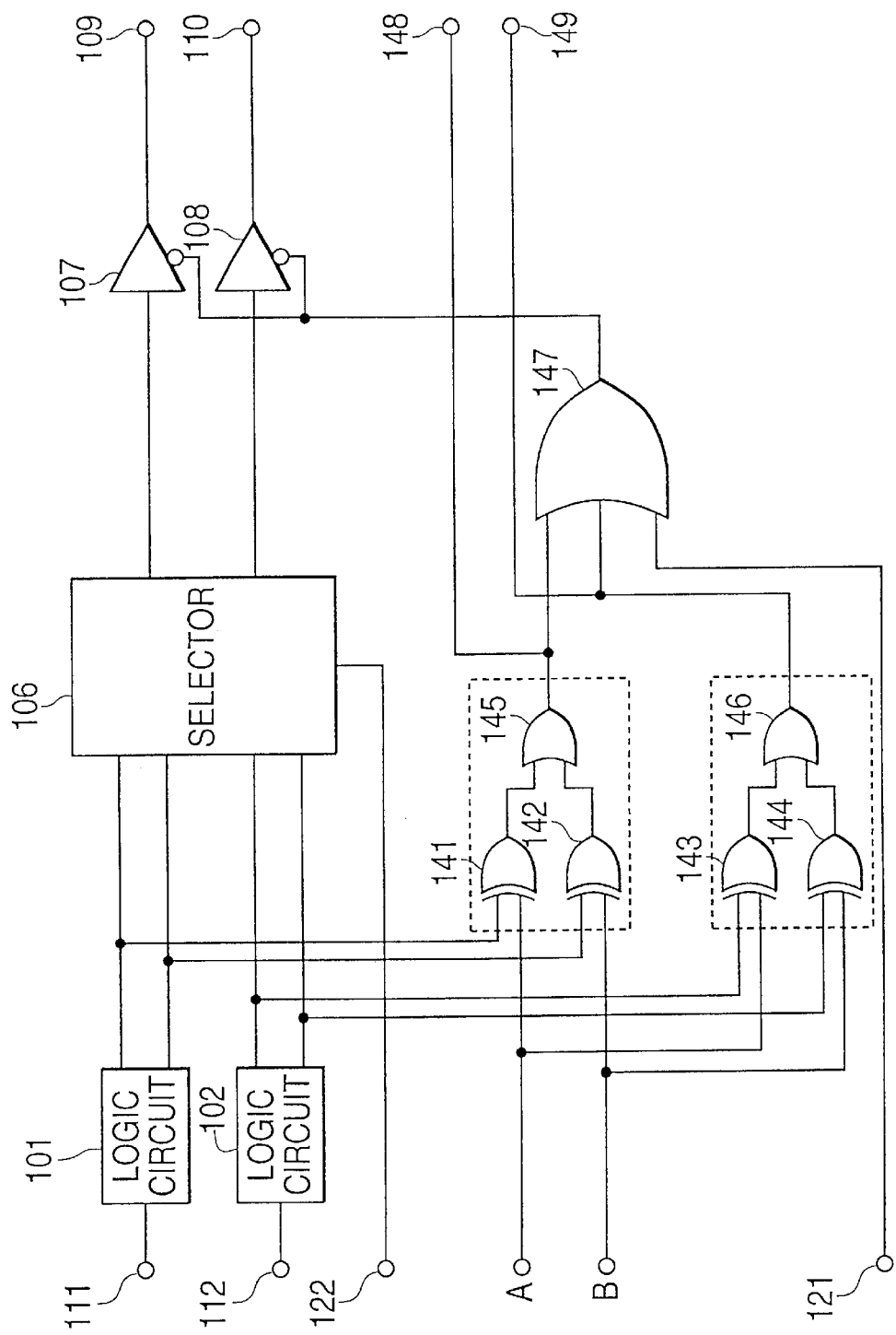
FIG. 4 is a circuit diagram showing a semiconductor integrated circuit according to a third preferred embodiment of the present invention.

FIG. 4 is a circuit diagram showing the semiconductor integrated circuit according to a third preferred embodiment of the present invention. The same reference is given to the same as that of first preferred embodiment, or a corresponding element, and thus dual explanation is omitted.

In this preferred embodiment, the number of exclusive OR circuits is determined by the number which is obtained by multiplying the number of logic circuits by the number of bits of the output signal of the logic circuit.

In this preferred embodiment, since the number of logic circuits is two and the output signal of the logic circuit is comprised of 2 bits, a total of four exclusive OR circuits 141, 142, 143, and 144 are provided.

Moreover, OR circuits 145 and 146 corresponding to the number of logic circuits are provided.

One comparison circuit comprises the exclusive OR circuit 141, the exclusive OR circuit 142 and an OR circuit 145. Another comparison circuit comprises the exclusive OR circuit 143, the exclusive OR circuit 144 and an OR circuit 146. A first output buffer circuit comprises the 3-state buffer 107 and the 3-state buffer 108.

A first input terminal of the exclusive OR circuit 141 receives the first bit of the output signal of the logic circuit 101. A second input terminal of the exclusive OR circuit 141 receives the first bit A of the expected value signal of the logic circuit.

A first input terminal of the exclusive OR circuit 142 receives the second bit of the output signal of the logic circuit 101. A second input terminal of the exclusive OR circuit 142 receives the second bit B of the expected value signal of the logic circuit.

A first input terminal of the exclusive OR circuit 143 receives the first bit of the output signal of the logic circuit 102. A second input terminal of the exclusive OR circuit 143 receives the first bit A of the expected value signal of the logic circuit.

A first input terminal of the exclusive OR circuit 144 receives the second bit of the output signal of the logic circuit 102. A second input terminal of the exclusive OR circuit 144 receives the second bit B of the expected value signal of the logic circuit.

That is, respective exclusive OR circuits compare one bit of the logic circuit with corresponding bit of the expected value of the output signal of the logic circuit. When the level of the expected value coincides with the level of the output signal from the logic circuit, the exclusive OR circuit outputs the L level. When the level of the expected value does not coincide with the level of the output signal from the logic circuit, the exclusive OR circuit outputs the H level.

A first input terminal of the OR circuit 145 is connected to an output terminal of the exclusive OR circuit 141, and a second input terminal of the OR circuit 145 is connected to an output terminal of the exclusive OR circuit 142.

The OR circuit 145 outputs the L level when both the output signals of the exclusive OR circuit 141 and the exclusive OR circuit 142 are the L level (i.e., when the output signal of the logic circuit 101 coincides with the expected value signal (A, B)).

The OR circuit 145 outputs the H level when either or all of the output signals of the exclusive OR circuit 141 and the exclusive OR circuit 142 is the H level (i.e., when the output signal of the logic circuit 101 does not coincide with the expected value signal (A, B)).

A first input terminal of the OR circuit 146 is connected to an output terminal of the exclusive OR circuit 143, and a second input terminal of the OR circuit 146 is connected to an output terminal of the exclusive OR circuit 144.

The OR circuit 146 outputs the L level when both the output signals of the exclusive OR circuit 143 and the exclusive OR circuit 144 are the L level (i.e., when the output signal of the logic circuit 102 coincides with the expected value signal (A, B)).

The OR circuit 146 outputs the H level when either or all of the output signals of the exclusive OR circuit 143 and the exclusive OR circuit 144 is the H level (i.e., when the output signal of the logic circuit 102 does not coincide with the expected value signal (A, B)).

An output terminal of the OR circuit 145 and an output terminal of the OR circuit 146 are connected to an output terminal 148 and an output terminal 149, respectively.

A first input terminal of an OR circuit 147 is connected to the output terminal of the OR circuit 145. A second input terminal of the OR circuit 147 is connected to the output terminal of the OR circuit 146. An output terminal of the OR circuit 147 is connected to the control terminals of the 3-state buffer 107 and the 3-state buffer 108.

The OR circuit 147 outputs the L level when both the output signals from the logic circuit 101 and the logic circuit 102 coincides with the expected value signal. The OR circuit 147 outputs the H level when both the output signals from the logic circuit 101 or both the output signals from the logic circuit 102 do not coincide with the expected value signal.

The 3-state buffer 107 and the 3-state buffer 108 transfer the output signal of the selector 106 to the output terminal 109 and the output terminal 110, respectively, when the output signal of the logic circuit 101 and the output signal of the logic circuit 102 coincide with the expected value signal.

The states of the 3-state buffer 107 and the 3-state buffer 108 become the high impedance state when either the output signal of the logic circuit 101 or the output signal of the logic circuit 102 does not coincide with the expected value signal.

In this preferred embodiment, it is possible to specify a defective logic circuitry by detecting the level of the output terminal 148 and the output terminal 149. Therefore, the efficiency of evaluation can be more improved.

In this preferred embodiment, two logic circuits which output the output signal comprised of two bits are explained.

However, the number of logic circuits is not limited to two but may also be three or more. The output signal may also be comprised of any number of bits. In that case, however, the number of exclusive OR circuits should be determined by the number which is obtained by multiplying the number of logic circuits by the number of bits of the output signal of the logic circuit. Moreover, the number of comparison circuits should be the same number as the logic circuits. The number of 3-state buffers should be the same number as bits of the logic circuit.

Fourth Preferred Embodiment

Figure 5:
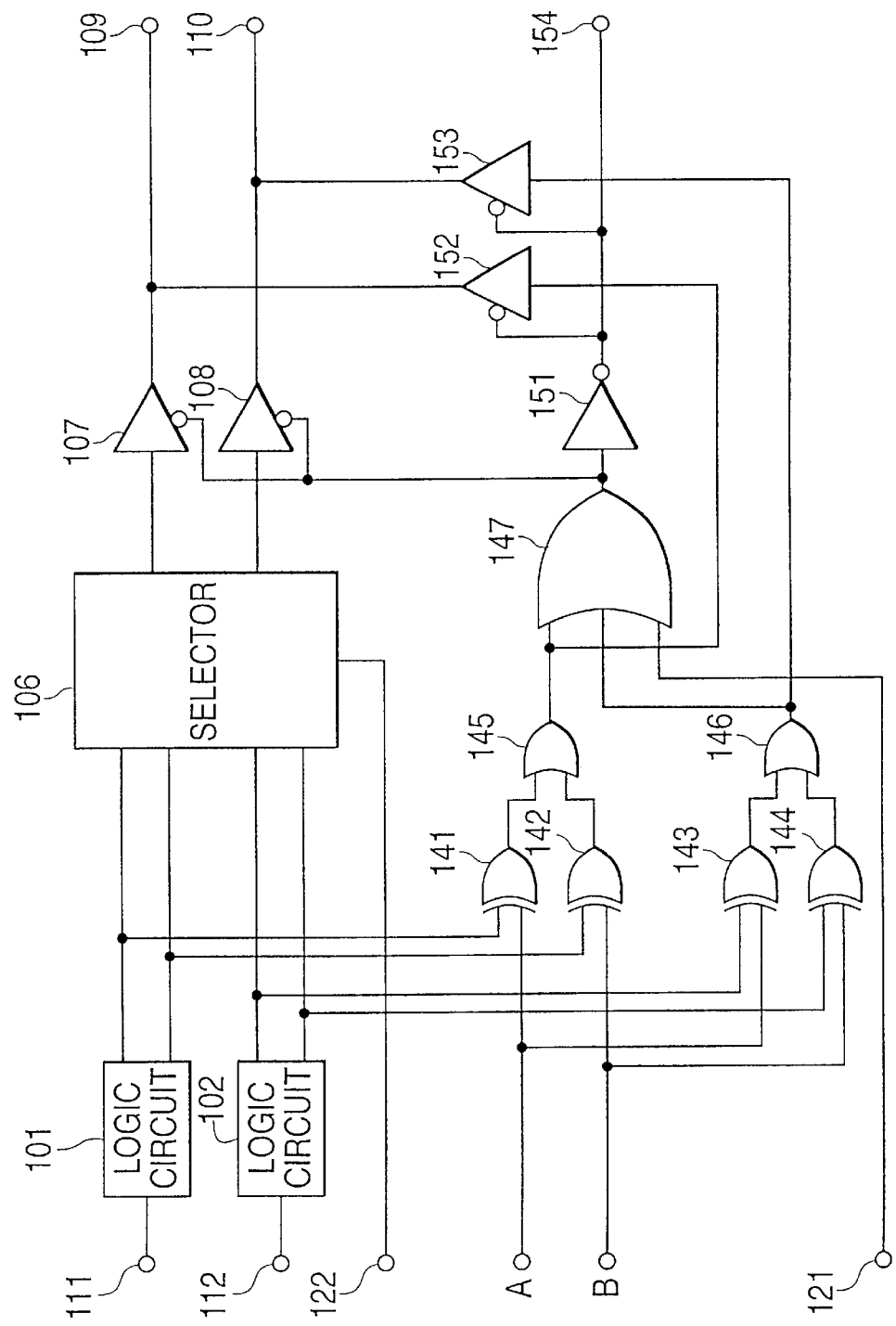
FIG. 5 is a circuit diagram showing a semiconductor integrated circuit according to a fourth preferred embodiment of the present invention.

FIG. 5 is a circuit diagram showing the semiconductor integrated circuit according to a fourth preferred embodiment of the present invention. The same reference is given to the same as that of the third preferred embodiment, or a corresponding element, and thus dual explanation is omitted. The integrated circuit of this preferred embodiment is a circuit that the output terminals 148 and 149 are deleted from the integrated circuit of the third preferred embodiment and an inverter 151, a 3-state buffer 152 and a 3-state buffer 153 are added to the integrated circuit of the third preferred embodiment. The second output buffer comprises the 3-state buffer 152 and the 3-state buffer 153.

The input terminal of the inverter 151 is connected to the output terminal of the OR circuit 147.

An input terminal of the 3-state buffer 152 and an input terminal of the 3-state buffer 153 are connected to the output terminal of the OR circuit 145 and the output terminal of the OR circuit 146, respectively.

The output terminal of the inverter 151 is connected to a control terminal of the 3-state buffer 152 and a control terminal of the 3-state buffer 153. An output terminal of the 3-state buffer 152 and an output terminal of the 3-state buffer 153 are connected to the output terminal 109 and the output terminal 110, respectively. The output terminal of the inverter 151 is also connected to an output terminal 154.

In this preferred embodiment, when the output terminal 154 is the H level (i.e., when all logic circuits are produced correctly and all of the output signals of the logic circuits coincide with the expected value signal), the 3-state buffer 107 and the 3-state buffer 108 transfer the output signal of the selector 106 to the output terminal 109 and the output terminal 110.

When the output terminal 154 is the L level (i.e., when one of the logic circuits has a defect, and thus one output signal of the logic circuits does not coincide with the expected value signal), the 3-state buffer 152 and the 3-state buffer 153 transfer the output signal of the OR circuit 145 and the output signal of the OR circuit 146 to the output terminal 109 and the output terminal 110, respectively.

At this time, if the level of the output terminal 109 is in the H level, it turns out that the logic circuit 101 has a defect, and if the level of the output terminal 109 is in the L level, it turns out that the logic circuit 101 is produced correctly. Moreover, if the level of the output terminal 110 is in the H level, it turns out that the logic circuit 102 has a defect, and if the level of the output terminal 110 is in the L level, it turns out that the logic circuit 102 is produced correctly.

Therefore, it is possible to judge whether or not the logic circuits is produced correctly, by detecting the level of the output terminal 154.

When one of the logic circuits has a defect, it is possible to specify which logic circuits has a defect by detecting the levels of the output terminal 109 and the output terminal 110.

Moreover, the output terminal 148 and the output terminal 149 which correspond to the number of logic circuits become unnecessary by addition of only the output terminal 154.

In this preferred embodiment, two logic circuits which output the output signal comprised of two bits are explained.

However, the output signal may be comprised of any number of bits. The number of logic circuits is not limited to two. The number of logic circuits may be the same number of bits of the output signal or may be less number of bits of the output signal.

In that case, however, the number of exclusive OR circuits should be determined by the number which is obtained by multiplying the number of logic circuits by the number of bits of the output signal of the logic circuit. Moreover, the number of OR circuits in the comparison circuits should be the same number as the logic circuits. The numbers of 3-state buffers in the first output buffer should be the same number as bits of the logic circuit. The number of 3-state buffers in the second output buffer should be the same number as the logic circuit.

In this preferred embodiment, although the logic circuit is used as two or more circuits which should be produced as the same structure, memory circuits where the same information is stored, i.e., such as RAM, may be used as the two or more circuits.

Moreover, in the third and the fourth preferred embodiments, ROMs which store the different information may be used instead of the logic circuits. In this case, the exclusive OR circuit corresponding to ROMs should input the expected value signal corresponding to the output signal of each ROM.

As explained above, according to the semiconductor integrated circuit of the present invention, since two or more circuits can be tested simultaneously, a test time can be reduced.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor integrated circuit comprising:
   a plurality of logic circuits each of which receives an input signal and generates an output signal comprising a plurality of bits;
   a selector which is coupled to said logic circuits and selectively transfers either one of the output signals output from said logic circuits in response to a selection signal;
   a comparator which compares an output signal output from one of said logic circuits with an output signal from another one of said logic circuits and outputs a result of the comparison;
   output terminals; and
   an output buffer which is coupled between said selector and said output terminals and controls transferring the output signal transferred from said selector to said output terminals in response to the result of the comparison.

2. A semiconductor integrated circuit as set forth in claim 1, wherein said comparator comprises exclusive OR circuits each of which compares one bit generated by one of said logic circuits with one bit generated by another logic circuit and outputs an output signal, and an OR circuit which receives the output signals output from the exclusive OR circuits and outputs the result of the comparison.

3. A semiconductor integrated circuit as set forth in claim 1, wherein said output buffer comprises 3-state inverters each of which is coupled between said selector and a corresponding one of said output terminals and controls transferring the output signal transferred from said selector to said output terminals in response to the result of the comparison.

4. A semiconductor integrated circuit as set forth in claim 2, wherein the output signal generated by said logic circuits comprises N bits, the number of exclusive OR circuits is N, wherein N is an integer and greater than one.

5. A semiconductor integrated circuit as set forth in claim 3, wherein the output signal generated by said logic circuits comprises N bits, the number of 3-state inverters is N, wherein N is an integer and greater than one.

6. A semiconductor integrated circuit as set forth in claim 4, wherein each of said exclusive OR circuits compares one bit generated by a respective one of said logic circuits with one bit, which corresponds to the one bit generated by the respective one of said logic circuits, generated by another respective one of said logic circuits.

7. A semiconductor integrated circuit as set forth in claim 5, wherein one of said 3-state inverters receives one bit generated by a respective one of said logic circuits and wherein another 3-state inverter receives another bit generated by another respective one of said logic circuits.

8. A semiconductor integrated circuit comprising:

a plurality of logic circuits each of which receives an input signal and generates an output signal comprising a plurality of bits;

a selector which is coupled to said logic circuits and selectively transfers either one of the output signals output from said logic circuits in response to a selection signal;

a plurality of comparators each of which compares an output signal output from corresponding ones of said logic circuits with an expected value signal and outputs a result of the comparison;

first output terminals;

second output terminals which receive the result of the comparison;

a gate circuit which receives the result of the comparison output from said comparators and outputs an output signal corresponding to the result of the comparison output from said comparators; and a first output buffer which is coupled between said selector and said first output terminals and controls transferring the output signal transferred from said selector to said first output terminals in response to the output signal output from said gate circuit.

9. A semiconductor integrated circuit as set forth in claim 8, further comprising a second output buffer which is coupled between said comparators and said first output terminals and controls transferring the result of the comparison output from said comparators to said first output terminals.

10. A semiconductor integrated circuit as set forth in claim 8, wherein said comparators include exclusive OR circuits each of which compares one bit of the output signal generated by one of said logic circuits with one bit of the expected value signal.

11. A semiconductor integrated circuit as set forth in claim 8, wherein said first output buffer comprises 3-state inverters each of which is coupled between said selector and corresponding ones of said first output terminals and controls transferring the output signal transferred from said selector to said first output terminals in response to the output signal output from said gate circuit.

12. A semiconductor integrated circuit as set forth in claim 10, wherein the output signal generated by said logic circuits comprises N bits, the number of 3-state inverters is N, wherein N is an integer an greater than one.

13. A semiconductor integrated circuit as set forth in claim 11, wherein the output signal generated by said logic circuits comprises N bits, the number of exclusive OR circuits in said respective comparators is N, wherein N is an integer and greater than one.

14. A semiconductor integrated circuit comprising:

a first logic circuit which receives an input signal and generates an output signal comprising a plurality of bits;

a second logic circuit which receives an input signal and generates an output signal comprising a plurality of bits;

a selector which is coupled to said first and second logic circuits and selectively transfers either one of the output signals output from said first and second logic circuits in response to a selection signal;

a comparator which compares the output signal output from said first logic circuit with the output signal output from said second logic circuit;

output terminals; and an output buffer which is coupled between said selector and said output terminals and controls transferring the output signal transferred from said selector to said output terminals in response to the result of the comparison.

15. A semiconductor integrated circuit as set forth in claim 14, wherein said comparator comprises:

a first exclusive OR circuit which compares one bit generated by said first logic circuit with one bit generated by said second logic circuit and outputs an output signal;

a second exclusive OR circuit which compares another bit generated by said first logic circuit with another bit generated by said second logic circuit and outputs an output signal; and an OR circuit which receives both output signals output from said first and second exclusive OR circuits and outputs the result of the comparison.

16. A semiconductor integrated circuit as set forth in claim 14, wherein said output buffer comprises 3-state inverters each of which is coupled between said selector and corresponding ones of said output terminals and controls transferring the output signal transferred from said selector to said output terminals in response to the result of the comparison.

17. A semiconductor integrated circuit as set forth in claim 16, wherein the output signals generated by said first and second logic circuits comprise N bits, the number of 3-state inverters is N, wherein N is an integer and greater than one.

18. A semiconductor integrated circuit as set forth in claim 17, wherein one of said 3-state inverters receives one bit generated by one of said first and second logic circuits and wherein another 3-state inverter receives another bit generated by one of said first and second logic circuits.

19. A semiconductor integrated circuit as set forth in claim 1, when said comparator compares respective bits of the output signal from the one of said logic circuits with same respective bits of the output signal from the another logic circuit.

20. A semiconductor integrated circuit as set forth in claim 1, wherein said logic circuits are memories.

* * * * *